(12) United States Patent
Chung et al.

(10) Patent No.: US 7,719,909 B2
(45) Date of Patent: May 18, 2010

(54) DRAM WRITING AHEAD OF SENSING SCHEME

(75) Inventors: Shine Chung, Hsinchu (TW); Cheng-Hsien Hung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

(21) Appl. No.: 12/100,329

(22) Filed: Apr. 9, 2008

(65) Prior Publication Data
US 2008/0205178 A1    Aug. 28, 2008

Related U.S. Application Data

(63) Continuation of application No. 11/593,776, filed on Nov. 7, 2006, now Pat. No. 7,376,027.

(51) Int. Cl.
*G11C 7/00* (2006.01)
(52) U.S. Cl. .............. 365/205; 365/202; 365/226; 365/189.08; 365/207; 365/189.15; 365/189.16
(58) Field of Classification Search .......... 365/205, 365/202, 226, 207, 189.08, 189.15, 189.16
See application file for complete search history.

(56) References Cited

U.S. PATENT DOCUMENTS

| | | | | | |
|---|---|---|---|---|---|
| 5,859,794 | A | * | 1/1999 | Chan | 365/149 |
| 5,859,807 | A | * | 1/1999 | Otori et al. | 365/208 |
| 5,905,686 | A | * | 5/1999 | Raad | 365/207 |
| 6,104,641 | A | * | 8/2000 | Itou | 365/189.14 |
| 6,262,922 | B1 | * | 7/2001 | Nakamura et al. | 365/196 |
| 6,337,824 | B1 | * | 1/2002 | Kono et al. | 365/207 |
| 6,344,990 | B1 | * | 2/2002 | Matsumiya et al. | 365/63 |
| 6,707,700 | B2 | * | 3/2004 | Kang | 365/145 |
| 6,882,578 | B2 | * | 4/2005 | Moore et al. | 365/189.15 |
| 6,909,644 | B2 | * | 6/2005 | Fujioka et al. | 365/196 |

OTHER PUBLICATIONS

Agata, Yasuhiro et al., "An 8-ns Random Cycle Embedded RAM Macro with Dual-Port Interleaved DRAM Architecture ($D^2$RAM)", IEEE Journal of Solid-State Circuits, vol. 35, No. 11, Nov. 2000, pp. 1668-1672.

Pilo, Harold, et al., "A 5.6-ns Random Cycle 144-Mb DRAM with 1.4 Gb/s/pin and DDR3-SRAM Interface", IEEE Journal of Solid-State Circuits, vol. 38, No. 11, Nov. 2003, pp. 1974-1980.

(Continued)

*Primary Examiner*—Viet Q Nguyen
(74) *Attorney, Agent, or Firm*—K&L Gates LLP

(57) ABSTRACT

This invention discloses a write-sensing circuit for a semiconductor memory having at least one memory block with a continuous word-line being coupled to all the memory cells in a column of the memory block and a continuous bit-line being coupled to all the memory cells in a row of the memory block, the write-sensing circuit comprising a first and a second sense amplifier belonging to the same memory block, a first switching device coupled between the first sense amplifier and a first power supply, the first switching device being controlled by a first signal, and a second switching device coupled between the second sense amplifier and the first power supply, the second switching device being controlled by a second signal different from the first signal, wherein when the first sense amplifier is activated, the second sense amplifier can remain de-activated.

18 Claims, 11 Drawing Sheets

OTHER PUBLICATIONS

Shirahama, Masanori et al., "A 400-Mhz Random-Cycle Dual-Port Interleaved DRAM ($D^2$RAM) with Standard CMOS Process", IEEE Journal of Solid-State Circuits, vol. 40, No. 5, May 2005, pp. 1200-1207.

* cited by examiner

DRAM WRITING AHEAD OF SENSING SCHEME

CROSS REFERENCE

This is a continuation of U.S. application Ser. No. 11/593,776 filed Nov. 7, 2006 now U.S. Pat. No. 7,376,027.

BACKGROUND

The present invention relates generally to dynamic random access memory (DRAM) circuits, and, more particularly, to design of DRAM write circuit.

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charges are stored in the capacitor, the cell is said to store a logic HIGH, depending on the convention used. Then if no charge is present, the cell is said to store a logic LOW. Since the charges in the capacitor dissipate over time, DRAM systems require additional refreshing circuitries to periodically refresh the charges stored in the capacitors. Since a capacitor can store only a very limited amount of charges, to fast distinguish the difference between a logic '1' and a logic '0', two bit-lines (BLs) are typically used for each bit with the first in the bit line pair known as a bit line true (BLT) and the other being the bit line complement (BLC). Prior to a sensing, BLT and BLC are equalized to the same voltage. Upon the sensing, the voltages of the BL pair start to split oppositely, e.g., if BLT swings to a higher voltage, then BLC swings to lower voltage. A sense amplifier compares BLT and BLC voltages and outputs either a high or a low voltage to represent a logic value stored in the bit.

The single NMOS transistor's gate is controlled by a word-line (WL). When the WL is asserted a logic high voltage, the single NMOS transistor will be turned on and allow the cell capacitor to be accessed.

In a large DRAM bank, memory cells are organized in blocks, and a bank may contain a plurality of blocks. A WL is coupled to all the cells in a row of a block and a BL pair is coupled to all the cells in a column of the block. Here the row or column is arbitrary, i.e., WLs may run in the column direction and BLs may run in row direction instead. A global bit-line (GBL) pair is coupled to all the BL pairs belonging to the same column of the plurality of blocks through select transistors, which is controlled, conventionally, by a single select signal for the entire bank. The GBL pairs are coupled to the data input/output through multiplexers. When writing or reading the DRAM cells, the select transistors are turned on, so that data can be written into the memory cells from the corresponding GBL pairs and through the corresponding BL pairs, or read from the memory cells through the corresponding BL pairs onto the corresponding GBL pairs. During memory cell refreshing, since the cells are not accessed, so that the select transistors need not be turned on.

In general, accessing a DRAM cell involves WL activation, signal development on the BL pairs, BL sensing, WL deactivation and BL equalization (EQ). BL sensing is a signal write back or refreshing process. When a DRAM cell is being written, outside voltage will charge the storage capacitor, there is no data loss issue. But if the memory cell is not being written and not fully refreshed before connecting its corresponding BL pair to its corresponding GBL pair, data stored in the memory cell may be lost due to large capacitive load of the GBL.

Assuming a 64-bit DRAM has 256 columns in a bank, then each time only ¼ of the BLs need to be accessed. However, because all the select transistors of an entire bank are controlled by a single signal in conventional DRAMs, all 256 BL pairs are connected to their corresponding GBL pairs during a write operation, even though only 64 GBL pairs are forced with outside voltage source. If the memory cells on the rest 192 BL pairs are not fully refreshed prior to the select transistor's turn-on, these memory cells may suffer data loss. For this reason, the write operation in conventional DRAM must be sequential, i.e., writing may only start after a sensing is completed.

FIG. 1 shows a timing sequence of writing in a conventional DRAM. Prior to the writing 108, the BLs are equalized in time slot 102. At the beginning of the writing, the WL starts to develop in time slot 104, and maintains activated throughout the entire write cycle 100. Sensing occurs in time slot 106. During this time, all the cells coupled to the activated WL are refreshed to their full capacity. Writing to the selected cells happens in time slot 108 after the sensing period 106 is completed. Due to these sequential executions, the writing cycle 100 is particularly long, which limits the overall speed of the DRAM.

One way to overcome this limitation is to selectively turn on only those select transistors for the BL pairs being accessed, while keep the rest of the select transistors in the memory bank in off state. But this requires additional select signal lines, which will increase the memory die size.

As such, what is desired is a DRAM writing scheme that allows early writing, i.e., simultaneous writing and sensing or even writing ahead of sensing, without increasing memory die size.

SUMMARY

This invention discloses a write-sensing circuit for a semiconductor memory having at least one memory block with a continuous word-line being coupled to all the memory cells in a column of the memory block and a continuous bit-line being coupled to all the memory cells in a row of the memory block, the write-sensing circuit comprising a first and a second sense amplifier belonging to the same memory block, a first switching device coupled between the first sense amplifier and a first power supply, the first switching device being controlled by a first signal, and a second switching device coupled between the second sense amplifier and the first power supply, the second switching device being controlled by a second signal different from the first signal. The first power supply may be either the Vss or the Vcc. The first and second switching devices are controlled by different signals so that the first and second sense amplifier may be powered up or activated at different time.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses a concurrent writing and sensing scheme in dynamic random access memories (DRAM) that can shorten the write cycle of the DRAM.

Figure 1:
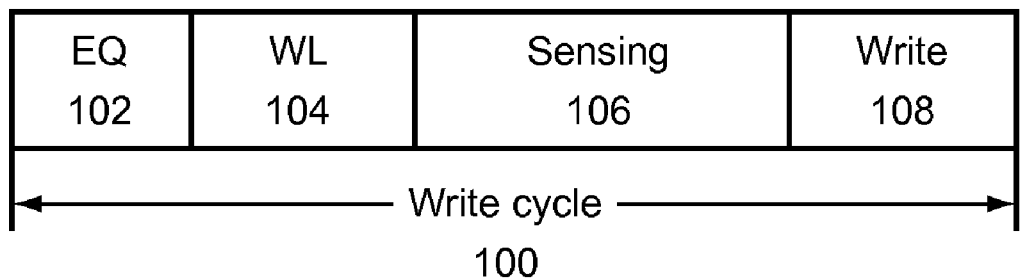
FIG. 1 illustrates a conventional write timing sequence.

FIG. 1 has already been described and discussed as the relevant background to the present invention. It requires no further discussion here.

Figure 2A:
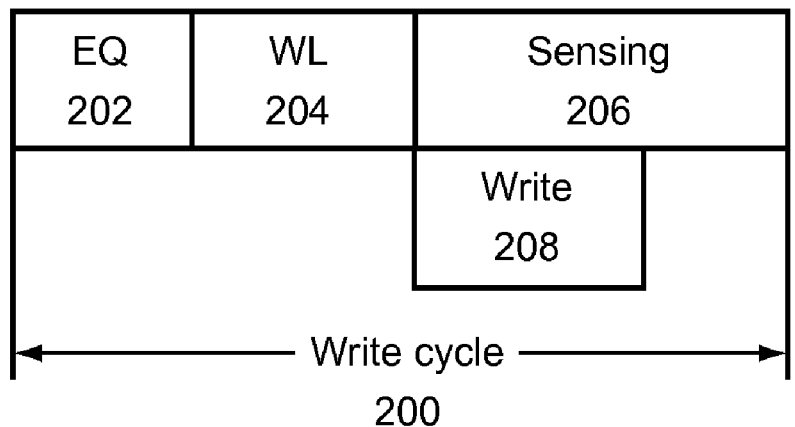
FIG. 2A illustrates a write cycle of a concurrent-writing-and-sensing scheme according to a first embodiment of the present invention.

FIG. 2A illustrates a write cycle 200 of a concurrent-writing-and-sensing scheme according to a first embodiment of the present invention. Here bit-lines (BLs) are first equalized in time slot 202. At the beginning of a writing, a selected word-line (WL) develops in time slot 204. Then sensing starts in time slot 206 as that of the conventional DRAM shown in FIG. 1. But the present invention starts writing in time slot 208 right after the WL is developed in time slot 204, concurrent to the sensing in time slot 206, therefore a write cycle 200 of the present invention is shortened comparing to the conventional write cycle 100 shown in FIG. 1.

Figure 2B:
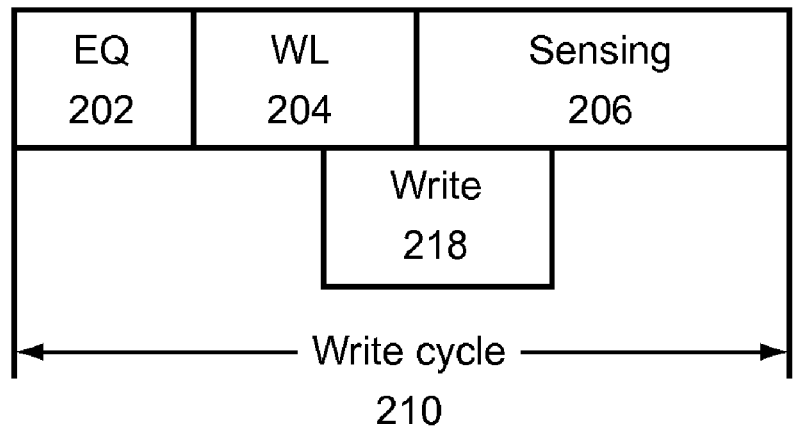
FIG. 2B illustrates another write cycle of a writing-ahead-of-sensing scheme according to a second embodiment of the present invention.

FIG. 2B illustrates another write cycle 210 of a writing-ahead-of-sensing scheme according to a second embodiment of the present invention. Here the BL equalization time slot 202, WL development time slot 204, and sensing time slot 206 are the same as those in the write cycle 200 shown in FIG. 2A. But the write time slot 218 starts right after the WL development begins in time slot 204, and before the sensing time slot 206 starts. Therefore, the write cycle 210 of FIG. 2B can be shorter than the write cycle 200 of FIG. 2A.

A key aspect of the present invention is to keep select transistors that connect BLs to their corresponding GBLs in off state, and only the selected BLs for writing are activated during a write operation, so that those non-accessed cells in a memory bank will not face data loss issue if the writing starts before a sensing ends. Without turning on the select transistors, the present invention writes data to memory cells through separate paths which will be described in details in following paragraphs.

Figure 3:
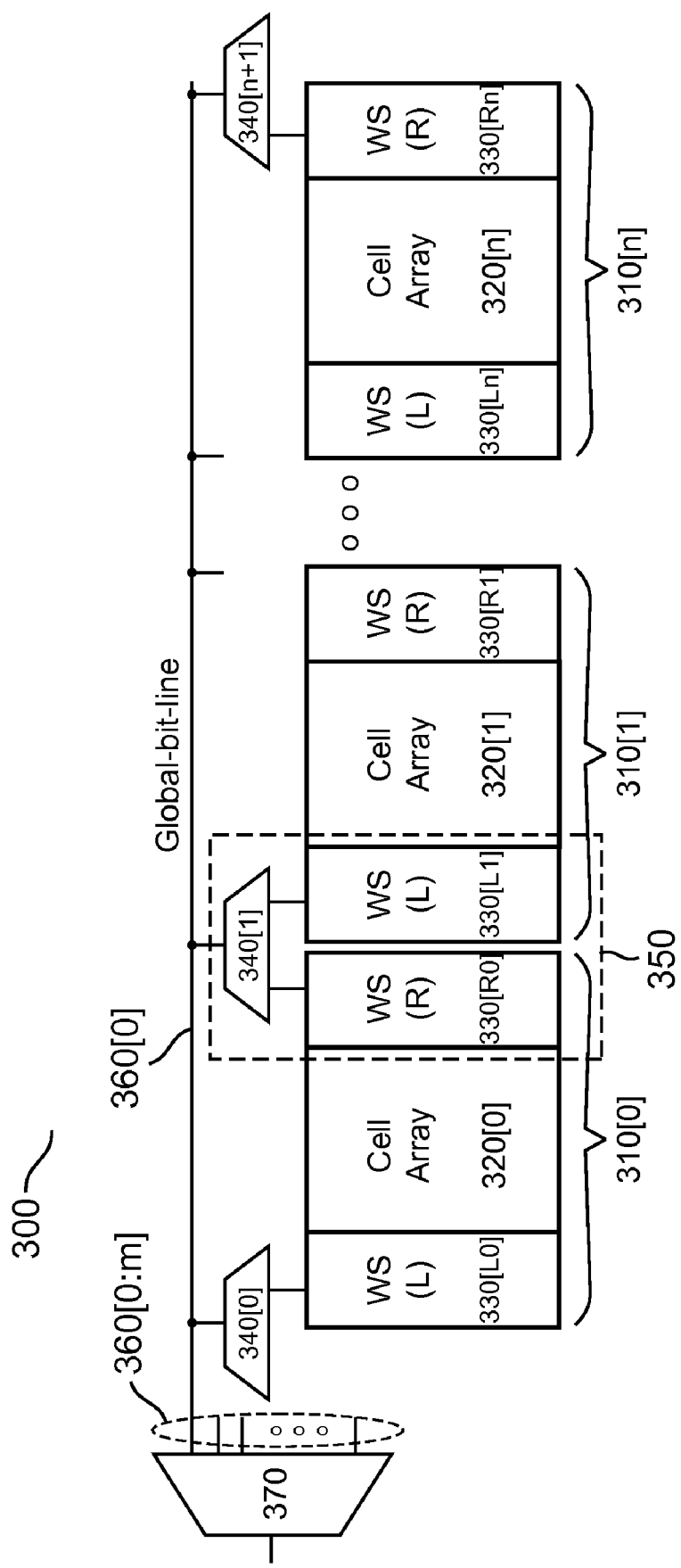
FIG. 3 is a schematic diagram illustrating an array structure of a DRAM according to the embodiments of the present invention.

FIG. 3 is a schematic diagram illustrating a memory core structure 300 of a DRAM according to the embodiment of the present invention. For illustrative purpose, the DRAM core structure 300 is shown to comprise a plurality of blocks 310[0:n], a plurality of blocks 340[0:n+1], a block 370 and a plurality of global-bit-lines 360[0:m−1] coupled to the block 370, where n and m are integers.

Referring again to FIG. 3, the blocks 310[0:n] may be implemented as memory cell blocks. Each memory cell block 310 may comprise a DRAM cell array 320, and two write-sensing (WS) blocks 330s, one 330[Lx] on the left, and the other 330[Rx] on the right, where x is an integer between 0 and n. Here the memory cell block 310 is defined as a continuous WL is coupled to all the cells in a column of the memory cell block 310, and a continuous BL is coupled to all the cells in a row of the same. A typical size of the array 320 is 32 rows (WLs) by 1024 columns (BLs). The block 340 may be implemented as a 2-to-1 multiplexer placed between two adjacent banks 310[0] and 310[1] as shown in FIG. 3. The multiplexer 340[1] selects one of the two WS blocks 330[R0] and 330[L1]. The output of the multiplexer 340[1] is coupled to the global-bit-line 360[0]. A left and a right adjacent WS blocks 330s and a multiplexer 340 form a read-write block 350. The block 370 may be implemented as a m-to-1 multiplexer to save line routings in the DRAM. Typically, m=8. FIG. 3 shows only array structure of one bit, some DRAM may access 64 bits, or columns at a time. Then for a word-line having 1024 columns, only 64 out of the 1024 columns are written and the rest are sensed and hence refreshed during a write cycle. Conventionally, the global-bit-lines 360s are always constructed in pairs to supply a differential voltage or current to a data sense amplifier.

Figure 4A:
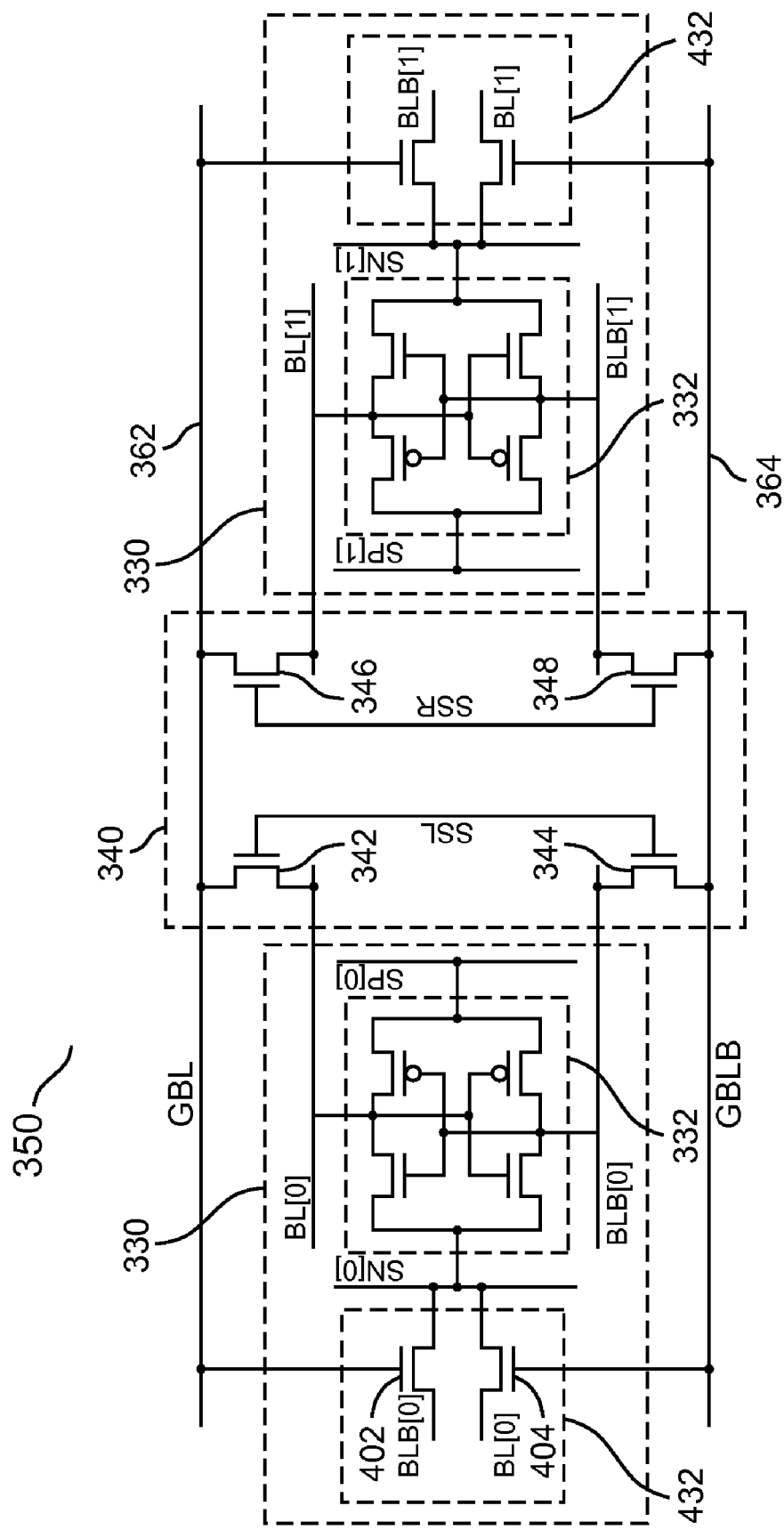
FIGS. 4A~4C are schematic diagrams illustrating three implementations of the write-sensing block.
Figure 4B:
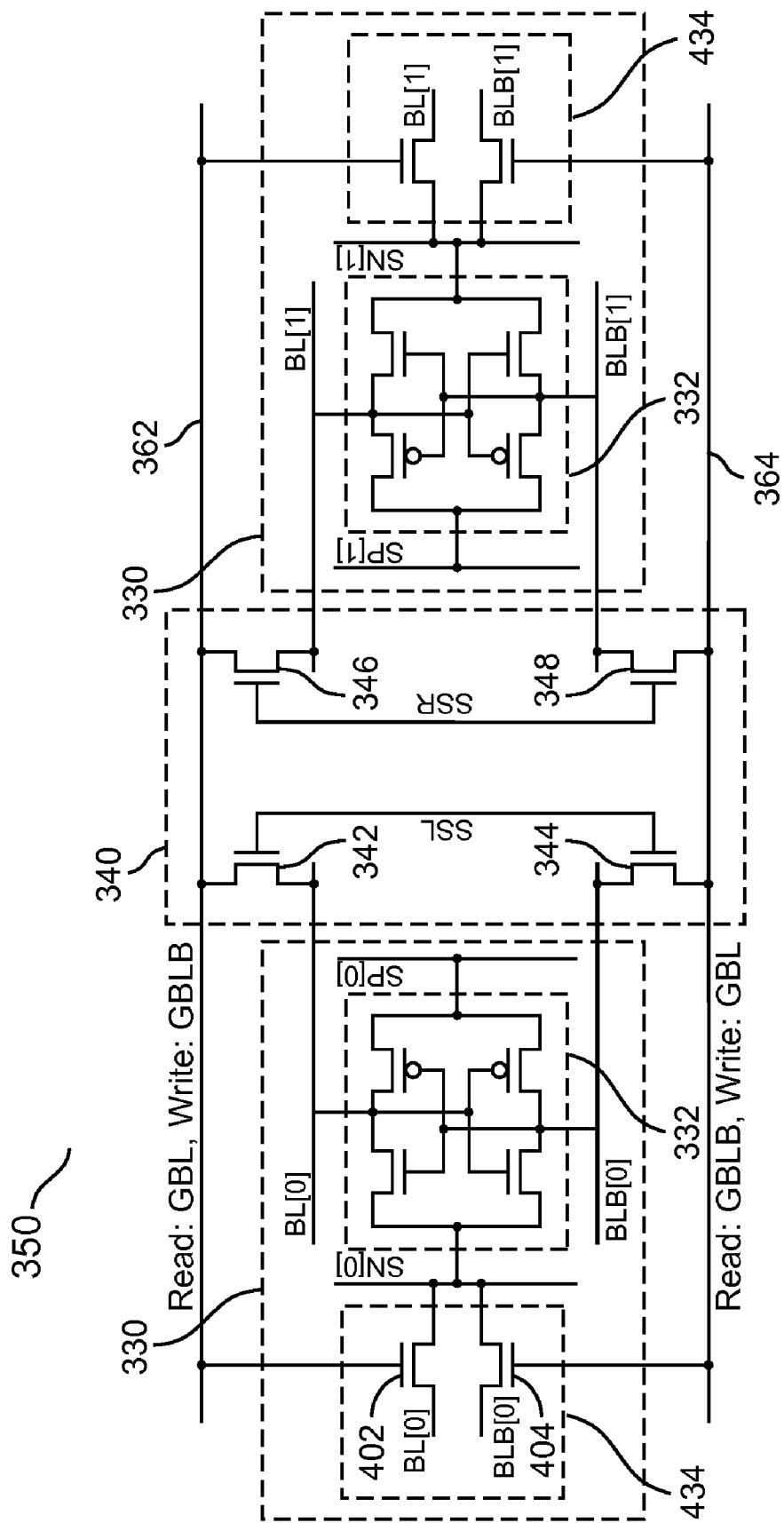
Figure 4C:
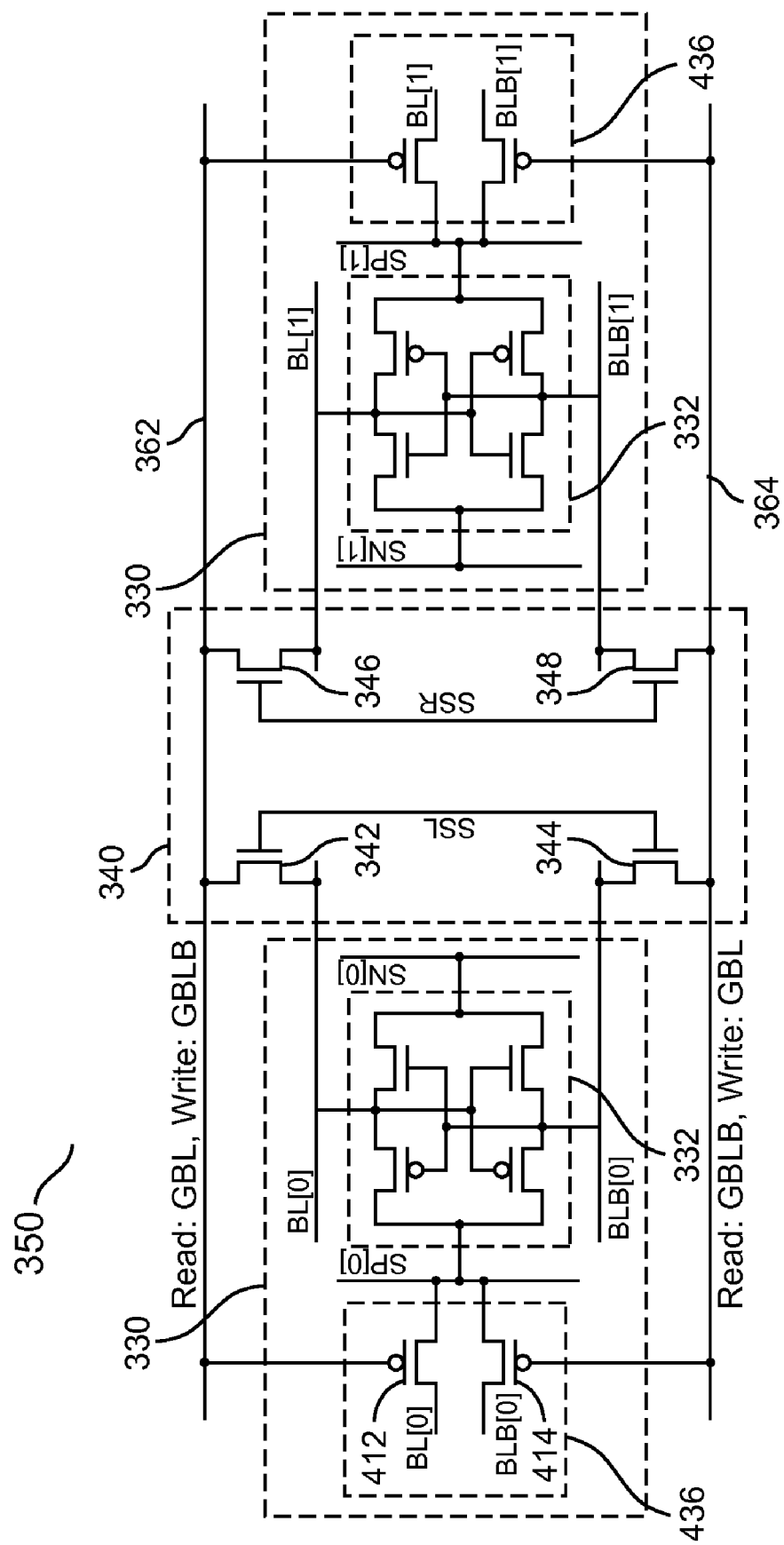

FIGS. 4A~4C are schematic diagrams illustrating three implementations of the read-write block 350. In general, the read-write block 350 comprises of the multiplexer 340 and two WS blocks 330s. The multiplexer 340 may be implemented as N-type metal-semiconductor-oxide (NMOS) transistors, 342, 344, 346 and 348, serving as pass gates between local bit-lines and global-bit-lines (GBLs). When signal SSL turns to a logic HIGH, while signal SSR turns to a logic LOW, the NMOS transistors 342 and 344 are turned on while the NMOS transistors 346 and 348 are turned off, so that the local bit-lines (BL) of the left write-sensing block 330 are selected to be coupled to the global-bit-lines (362 and 364), i.e., BL[0] is coupled to GBL 362, and BLB[0] is coupled to GBLB 364. On the other hand, when signal SSL turns to the logic LOW, while signal SSR turns to a logic HIGH, the NMOS transistors 342 and 344 are turned off while the NMOS transistors 346 and 348 are turned on, so that local bit-lines (BL) of the right write-sensing block 330 are selected to be coupled to the global-bit-lines (362 and 364), i.e., BL[1] is coupled to GBL 362, and BLB[1] is coupled to GBLB 364.

Referring to FIGS. 4A~4C, the WS block 330 comprises a local BL sense amplifier block 332 and a local BL switching block 334. The sense amplifier block 332 may be implemented as a conventional cross-coupled inverter pair. To activate the sense amplifier block 332, signal SP will be pulled up to a positive high supply voltage (Vcc), and signal SN will be pulled down to a complimentary low supply voltage (Vss). Differences among implementations shown in FIG. 4A~4C are in the formations and connections of the BL switching block 432 in FIG. 4A, 434 in FIG. 4B and 436 in FIG. 4C.

Referring to FIG. 4A, the BL switching block 432 is formed by two NMOS transistors 402 and 404. Both sources of the NMOS transistors 402 and 404 are coupled to the signal SN. A drain and a gate of the NMOS transistor 402 are coupled to the BLB and global-bit-line 362, respectively. A drain and a gate of the NMOS transistor 404 are coupled to the BL and global-bit-line 364, respectively. During both read and write operations, the global-bit-lines 362 and 364 are consistently coupled to GBL and GBLB, respectively. Note that in FIG. 4A, the bit-lines at the drain of the NMOS transistor 402 and 404 and the bit-lines at the output of the sense amplifier 332 are twisted.

Referring to FIG. 4B, the BL switching block 434 is also formed by two NMOS transistors 402 and 404. Both sources of the NMOS transistors 402 and 404 are coupled to the signal SN. A drain and a gate of the NMOS transistor 402 are coupled to the BL and global-bit-line 362, respectively. A drain and a gate of the NMOS transistor 404 are coupled to the BLB and global-bit-line 364, respectively. During read operation, the global-bit-lines 362 and 364 are coupled to GBL and GBLB, respectively. During write operation, instead, the global-bit-lines 362 and 364 are coupled to GBLB and GBL, respectively. By swapping the global-bit-lines, the local bit-lines may avoid the twisting, therefore saving layout space and complexity.

Referring to FIG. 4C, the BL switching block 436 is formed by two P-type metal-semiconductor-oxide (PMOS) transistors 412 and 414. Both sources of the PMOS transistors 412 and 414 are coupled to the signal SP. A drain and a gate of the PMOS transistor 412 are coupled to the BL and global-bit-line 362, respectively. A drain and a gate of the PMOS transistor 414 are coupled to the BLB and global-bit-line 364, respectively. During read operation, the global-bit-lines 362 and 364 are coupled to GBL and GBLB, respectively. During write operation, instead, the global-bit-lines 362 and 364 are coupled to GBLB and GBL, respectively. By swapping the global-bit-lines, the local bit-lines may avoid the twisting, therefore save layout space and complexity.

The DRAM cell and local bit-lines (not shown) are operated as conventional DRAMs, i.e., the local bit-lines may be pre-charged to Vcc/2, and during sensing, the state of a selected DRAM cell may cause the bit-line pair to develop a differential voltage, which will be amplified by the BL sense amplifier 332 to eventually rail-to-rail voltage levels.

During read operation, the global-bit-line 362 and 364 are pre-charged to Vss for read-write block 350 shown in FIGS. 4A and 4B, and pre-charged to Vcc for read-write block 350 shown in FIG. 4C. The rest of the read operation is identical to all three implementations shown in FIGS. 4A~4C. At the start of a read, the pull-downs and equalizers (not shown) of local bit-lines are de-asserted, and a selected word-line (not shown) is asserted. In order to activate the BL sense amplifier, the signals SN and SP are pulled to Vss and Vcc, respectively. After the BL is sensed, either signal SSL or signal SSR will be turned on. In case the global-bit-lines 362 and 364 are pre-charged to Vss, if BL has developed to the logic HIGH, then the global-bit-line 362 will be pulled to the logic HIGH, while the global-bit-line 364 remains low. Then the differential voltage between the global-bit-lines 362 and 364 can be detected by a sense amplifier (not shown) after the multiplexer 370 shown in FIG. 3. In case the global-bit-lines 362 and 364 are pre-charged to Vcc, a logic LOW bit-line will develop the differential voltage between the global-bit-line 362 and 364.

Referring to FIGS. 4A and 4B, since the global-bit-lines 362 and 364 are pre-charged to Vss, and their voltage swing during sensing will not be high enough to turn on the NMOS transistor 402 or 404 before the sensing ends, so the NMOS transistor 402 and 404 are always off during read operation. The implementations shown in FIGS. 4A and 4B work just as that in a conventional DRAM.

Referring to FIG. 4C, since the global-bit-lines 362 and 364 are pre-charged to Vcc, and their voltage swing during sensing will not be lower enough to turn on the PMOS transistor 412 or 414 before the sensing ends, so the PMOS transistor 412 and 414 are always off during read operation. The implementation shown in FIG. 4C also works just as that in a conventional DRAM.

During the write operation for the implementations shown in FIGS. 4A~4C, both signals SSL and SSR remain de-asserted at the logic LOW, so that none of the inputs of multiplexer 340 are selected. At the start of a writing, as in the read case, the bit-line pull-up and equalizer are turned off, and a selected word-line is asserted, and then the bit-line sense amplifier 332 is activated by pulling signal SN to Vss and signal SP to Vcc. For only those selected columns, their corresponding global-bit-lines are driven to a complimentary one-HIGH-one-LOW voltages, hence writing data into the DRAM cells on the asserted word-line and the selected global-bit-lines. The rest of the global-bit-lines remains pre-charged, and the bit-line and sense amplifier conditions are just like that in a read operation, so the DRAM cells on the asserted word-line but the unselected global-bit-lines are sensed and hence refreshed. How data are exactly written into the DRAM cells are described in the following paragraphs.

Referring to FIG. 4A, when intending to write the logic LOW into a selected DRAM cell, the corresponding global-bit-lines 362 and 364 or GBL and GBLB are driven to the logic LOW and HIGH, respectively. Then the NMOS transistors 402 and 404 in the switching block 432 are turned off and on, respectively. As signal SN has been pulled to Vss, so that the turned-on NMOS transistor 404 will force BL voltage down to Vss. With the amplification of the BL sense amplifier 332, the BL and BLB will eventually be driven to Vss and Vcc, respectively, therefore, a logic LOW will be written into the DRAM cell on the BL. Oppositely, when intending to write a logic HIGH into a selected DRAM cell, the corresponding global-bit-lines 362 and 364 or GBL and GBLB are driven to the logic HIGH and LOW, respectively. In this case the BL and BLB are driven to logic HIGH and LOW, respectively, and hence a logic HIGH will be written into the DRAM cell on the BL.

Referring to FIG. 4B, when intending to write the logic LOW into a selected DRAM cell, the corresponding global-bit-lines 362 and 364 or GBLB and GBL are driven to the logic HIGH and LOW, respectively. Note that the global-bit-lines 362 and 364 are coupled to GBLB and GBL, respectively, during write operation while they are coupled to GBL and GBLB, respectively, during read operation. Then the NMOS transistors 402 and 404 in the switching block 434 are turned on and off, respectively. As signal SN has been pulled to Vss, so that the turned-on NMOS transistor 402 will force BL voltage down to Vss. With the amplification of the BL sense amplifier 332, the BL and BLB will eventually be driven to Vss and Vcc, respectively, therefore, a logic LOW will be written into the DRAM cell on the BL. Oppositely, when intending to write a logic HIGH into a selected DRAM cell, the corresponding global-bit-lines 362 and 364 or GBLB and GBL are driven to the logic LOW and HIGH, respectively. In this case the BL and BLB are driven to the logic HIGH and LOW, respectively, and hence a logic HIGH will be written into the DRAM cell on the BL.

Referring to FIG. 4C, when intending to write the logic LOW into a selected DRAM cell, the corresponding global-bit-lines 362 and 364 or GBLB and GBL are driven to the logic HIGH and LOW, respectively. Note that the global-bit-lines 362 and 364 are coupled to GBLB and GBL, respectively, during write operation while they are coupled to GBL and GBLB, respectively, during read operation. Then the PMOS transistors 412 and 414 in the switching block 436 are turned off and on, respectively. As signal SP has been pulled to Vcc, so that the turned-on PMOS transistor 402 will force BLB voltage up to Vcc. With the amplification of the BL sense amplifier 332, the BL and BLB will eventually be driven to Vss and Vcc, respectively, therefore, a logic LOW will be written into the DRAM cell on the BL. Oppositely, when intending to write a logic HIGH into a selected DRAM cell, the corresponding global-bit-lines 362 and 364 or GBLB and GBL are driven to the logic LOW and HIGH, respectively. In this case the BL and BLB are driven to the logic HIGH and LOW, respectively, and hence a logic HIGH will be written into the DRAM cell on the BL.

Although only one example employing PMOS transistors in the switching block 436 is shown in FIG. 4C, one having skill in the art would recognize that PMOS transistors may also be used to construct a circuit similar to the one shown in FIG. 4A with bit-lines twisted, yet, global-word-line polarities need not be swapped when operations changing from read to write.

In essence, the writing scheme illustrated in FIGS. 4A~4C utilizes the data themselves on the GBLs to selectively pull the BLs to their desired states for writing their corresponding memory cells without turning on the select transistors. Also note that in all three implementations of the read-write block 350 shown in FIGS. 4A~4C, writing to selected DRAM cells happens concurrently with the sensing, i.e., refreshing of the none selected DRAM cells in the same asserted word-line, therefore, the write cycle according to the embodiments of the present invention takes approximately the same amount of time, and the overall speed of the DRAM may be increased. Since there are only two transistors (432, 434 or 436) are added to the BL sense amplifier 332, they can be inserted in the layout pitch of the existing BL sense amplifier 332, so that the memory die size do not need to be increased.

Figure 5A:
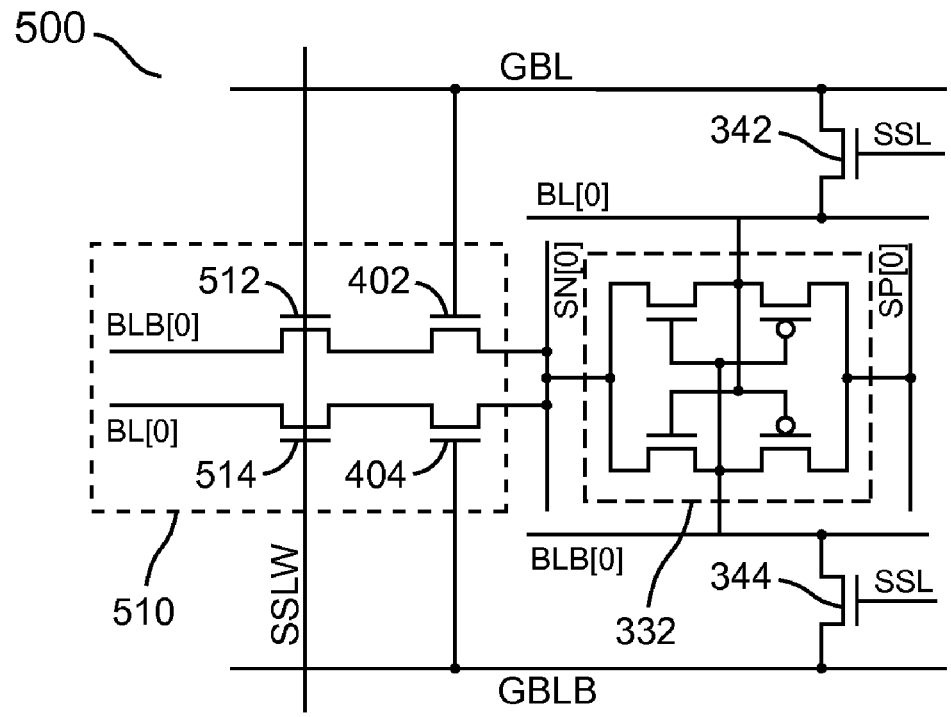
FIGS. 5A~5C are schematic diagrams illustrating three alternative implementations of the write-sensing block in accordance with the present invention.
Figure 5B:
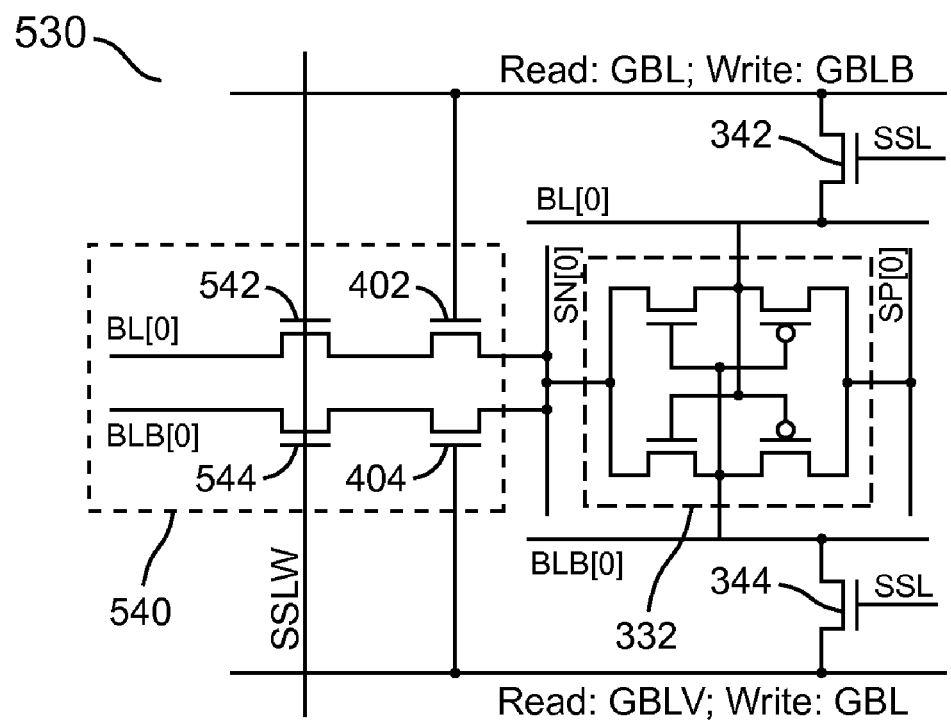
Figure 5C:
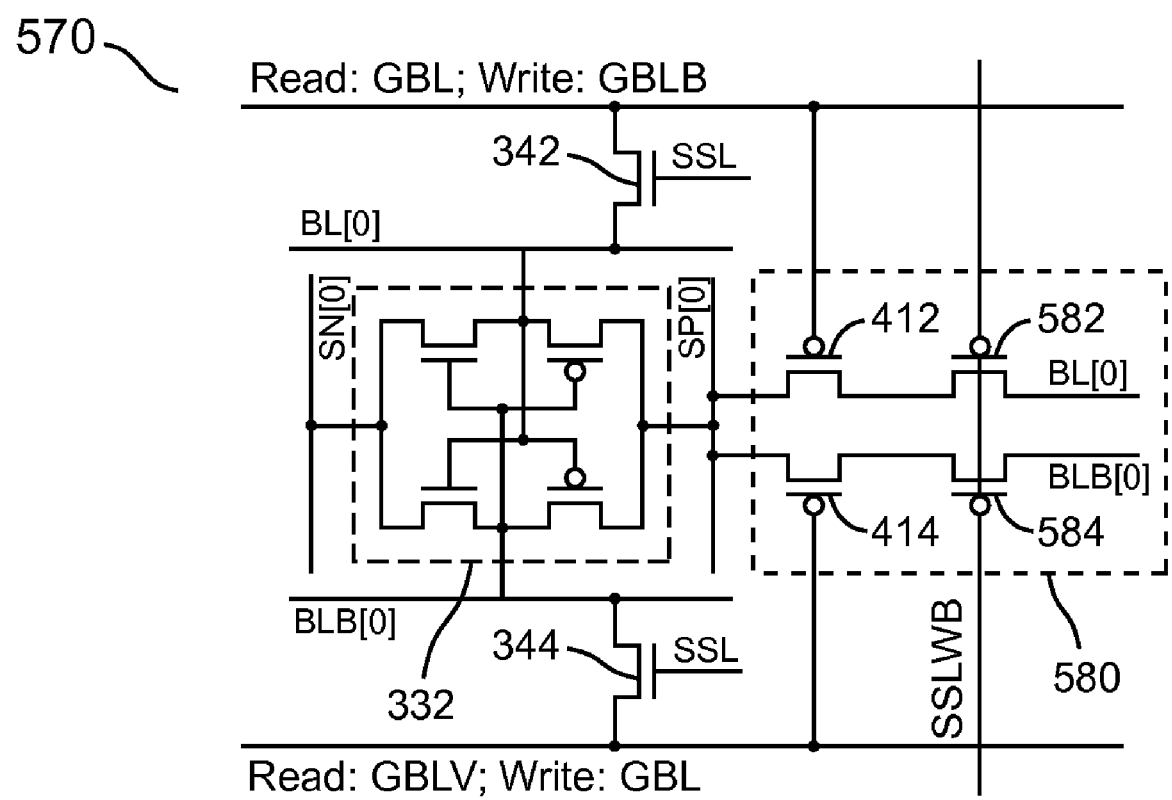

FIGS. 5A~5C are schematic diagrams illustrating three alternatives to the concurrent-write-and-sensing scheme shown in FIGS. 4A~4C according to the embodiments of the present invention. Referring to FIG. 5A, the circuit 500 is an alternative to the circuit 330 in FIG. 4A. The circuit 500 adds a pair of NMOS transistors 512 and 514 coupled between the local bit-lines, BL[0] and BLB[0], and the NMOS transistors 402 and 404, respectively. The added NMOS transistors 512 and 514 are controlled by a write select signal SSLW, which will be kept in the logic HIGH for the selected sense amplifiers and in the logic LOW for the unselected sense amplifiers during a write operation. Therefore, the unselected BL pairs will not be subjected to the voltage of the node SN[0].

Similarly, the circuit 530 shown in FIG. 5B is an alternative to the circuit 330 in FIG. 4B. Only NMOS transistors 542 and 544 are added and controlled by the write select signal SSLW, which will be kept in the logic HIGH for the selected sense amplifiers and in the logic LOW for the unselected sense amplifiers during a write operation.

Referring to FIG. 5C, the circuit 570 corresponds to circuit 330 in FIG. 4C, with only PMOS transistors 582 and 584 added to the circuit 436 in FIG. 5C. The PMOS transistors 582 and 584 coupled between the local bit-lines, BL[0] and BLB[0], and the PMOS transistors 412 and 414, respectively. The added PMOS transistors 582 and 584 are controlled by a write select signal SSLWB, which will be kept in the logic LOW for the selected sense amplifiers and in the logic HIGH for the unselected sense amplifiers during a write operation. Therefore, the unselected BL pairs will not be subjected to the voltage of the node SP[0].

Figure 6:
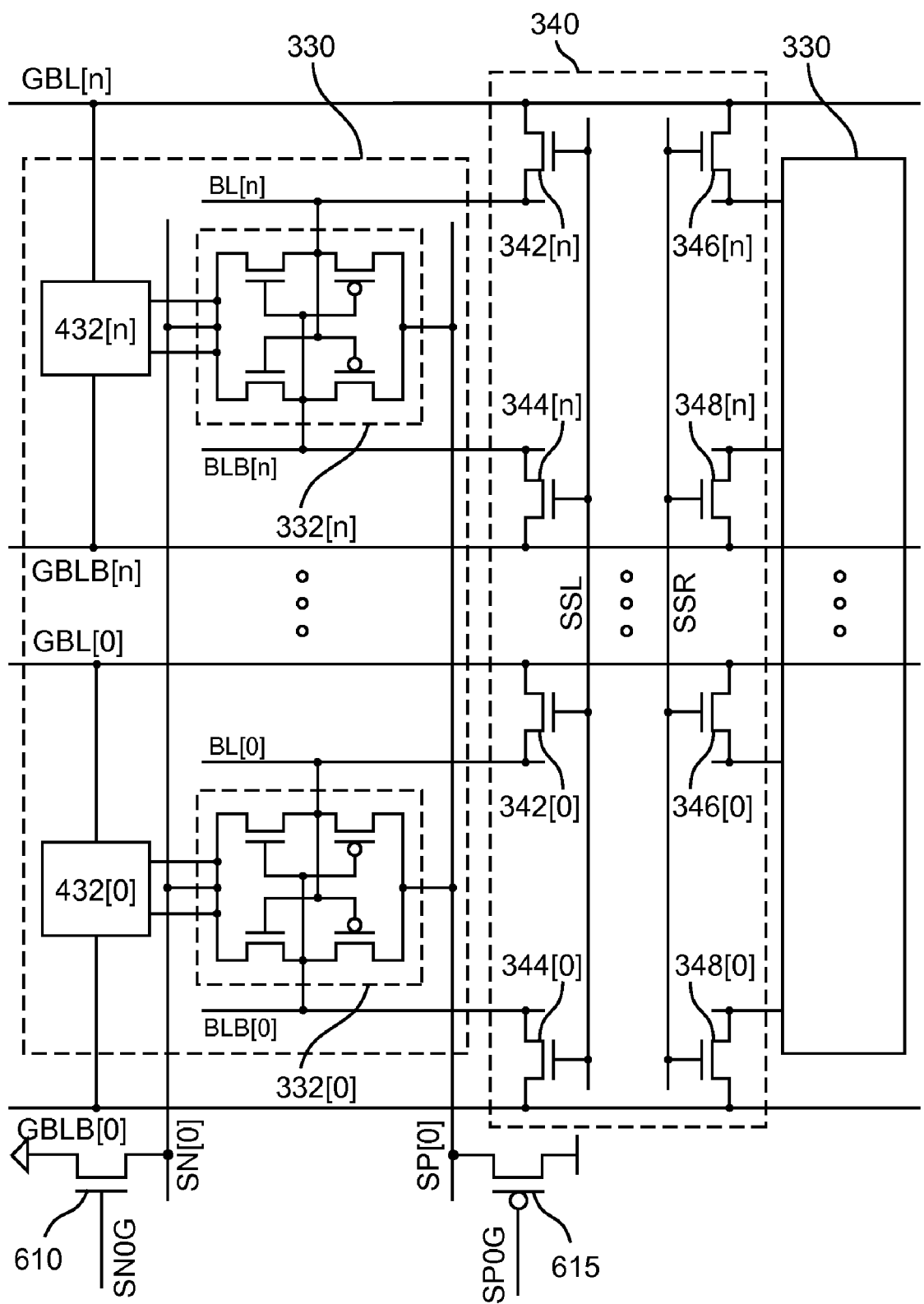
FIG. 6 is a schematic diagram illustrating a conventional power supply control for sense amplifiers.

FIG. 6 is a schematic diagram illustrating a conventional power supply control for sense amplifiers. The multiplexer 340 comprises NMOS transistors 342[0:$n$], 344[0:$n$], 346[0:$n$] and 348[0:$n$], where n is an integer. The NMOS transistors 342[0:$n$] and 344[0:$n$] are controlled by a left select signal SSL. The NMOS transistors 346[0:$n$] and 348[0:$n$] are controlled by a right select signal SSR. When the signal SSL turns to the logic HIGH, a local bit-line BL[0] is connected to a global bit-line GBL[0] by the NMOS transistor 342[0]. Similarly, BLB[0] is connected to GBLB[0] by the NMOS transistor 344[0], BL[n] is connected to GBL[n] by the NMOS transistor 342[$n$], and BLB[n] is connected to GBLB[n] by the NMOS transistor 344[$n$].

Referring again to FIG. 6, a conventional WS block 330 comprises a plurality of sense amplifiers 332[0:$n$], one for each BL pair, BL[i] and BLB[i], where i=0~n. Each sense amplifier 332[$i$] comprises a pair of cross coupled inverters being driven by the corresponding BL pair, BL[i] and BLB[i], and drawing power from the nodes SN[0] and SP[0], which are both kept at one half of the memory power supply Vcc when the sense amplifiers are not activated. Upon an activation of the sense amplifiers, the nodes SN[0] and SP[0] are simultaneously pulled to the ground Vss and the Vcc, respectively. A NMOS transistor 610 determines when the node SN[0] is connected to the Vss. A PMOS transistor 615 determines when the node SP[0] is connected to the Vcc. In conventional DRAMs, the nodes SN[0] and SP[0] are connected to all the sense amplifiers 332[0:$n$] in one block as shown in FIG. 6. Therefore, all the sense amplifiers 432[0:$n$] have to be activated and deactivated at the same time. This makes writing data before activating sense amplifiers 332[0:$n$] impossible as the writing as depicted in FIGS. 4A~4C requires activations of the corresponding sense amplifiers. The early write will prematurely activate unselected sense amplifiers as they are connected to the same nodes SN[0] and SP[0].

Figure 7A:
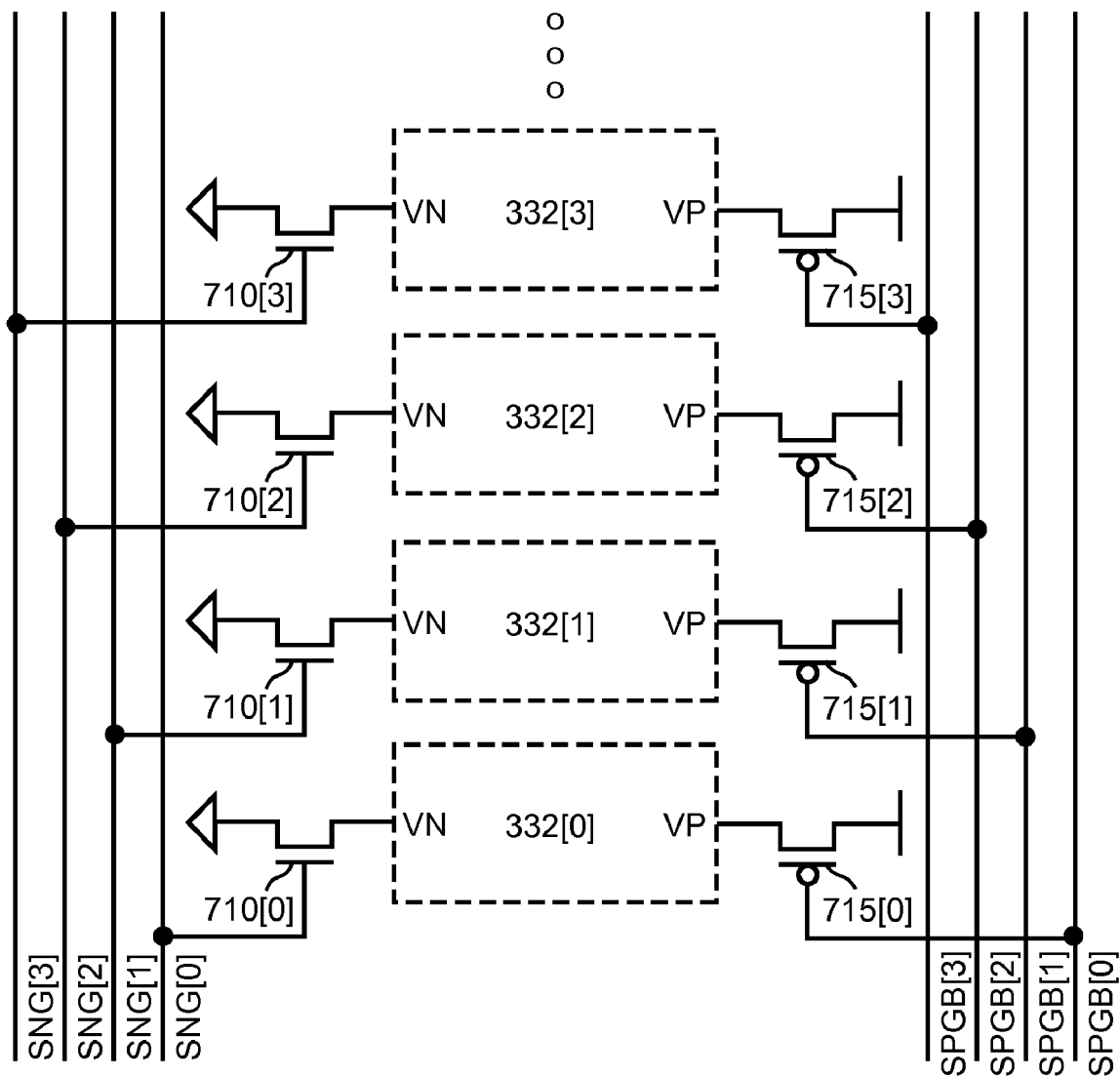
FIGS. 7A~7C are schematic diagrams illustrating power supply controls for sense amplifiers according to embodiments of the present invention.
Figure 7B:
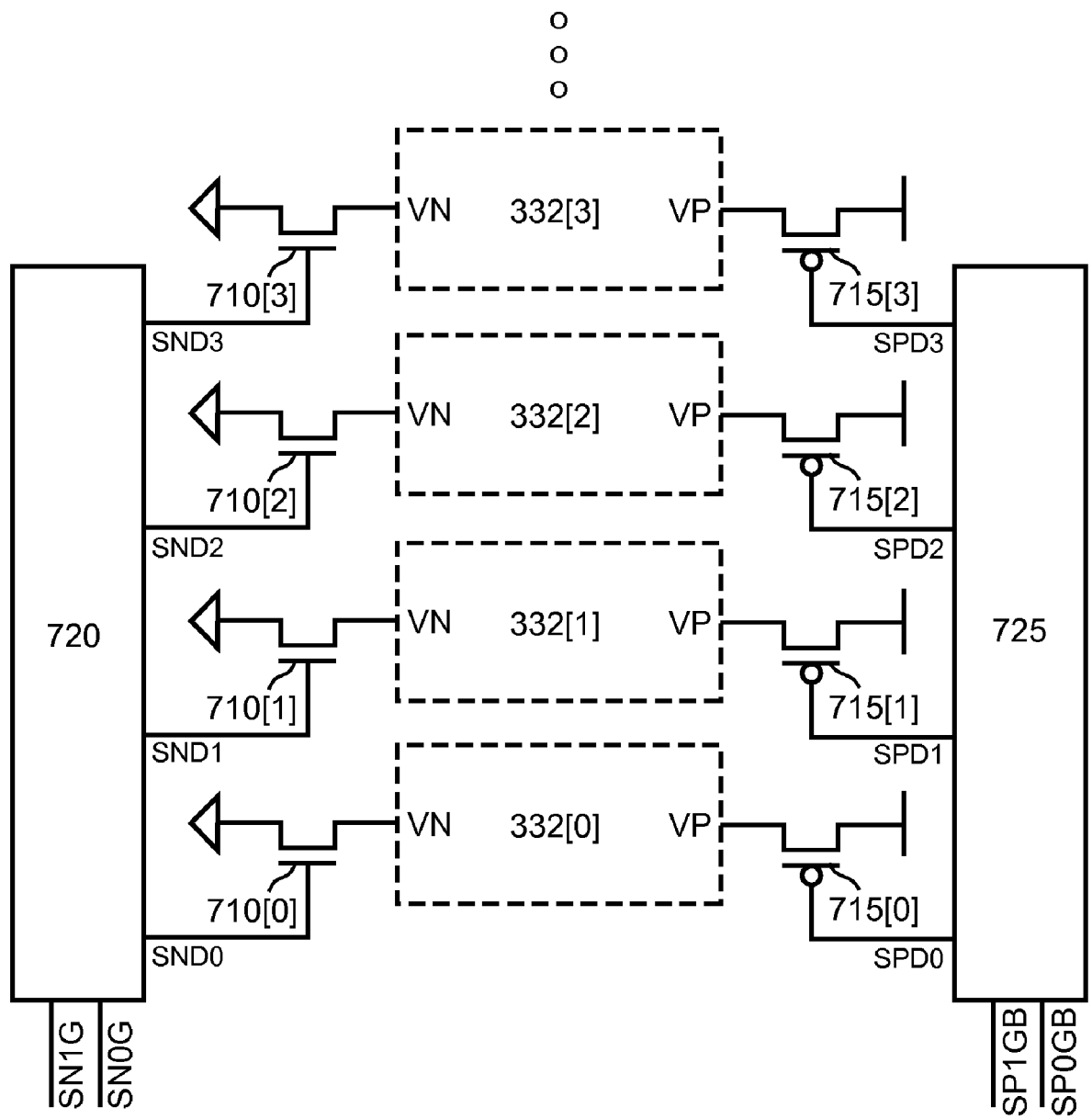
Figure 7C:
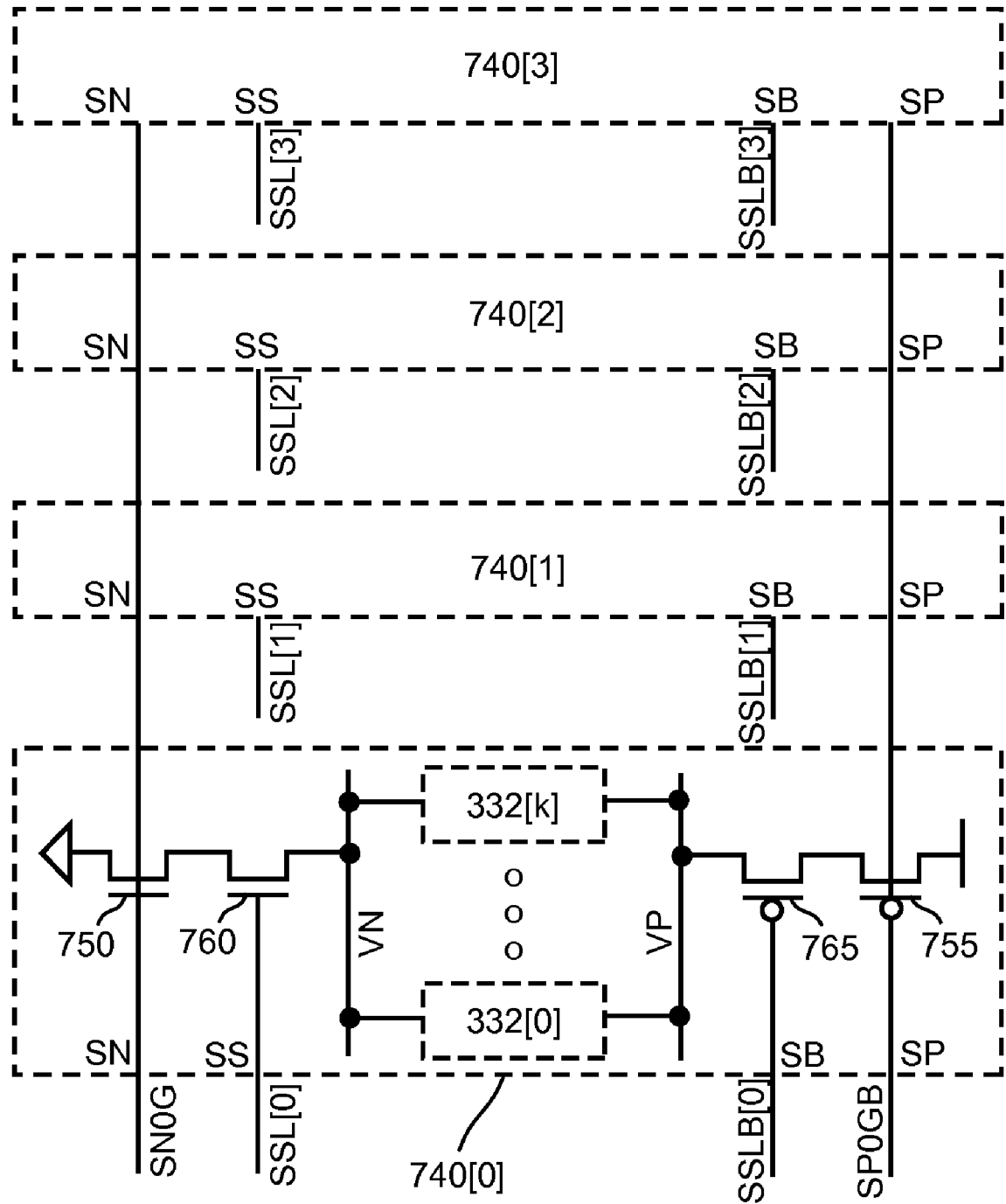

FIGS. 7A~7C are schematic diagrams illustrating power supply controls for sense amplifiers according to embodiments of the present invention. Unlike the conventional power supply control shown in FIG. 6, the new power supply controls supply powers to the selected and unselected sense amplifiers separately. In an early write scheme, only the selected sense amplifiers have power being switched on, and the rest unselected sense amplifiers in the same block do not have power being switched on. If a block has 128 rows, and only 32 of them are accessed at a time, then the 128 rows of sense amplifiers are grouped into four sectors, and each sector's power supply is individually controlled. FIGS. 7A~7C use the four-sector-block as an example to illustrate the inventive separate power supply control for the sense amplifiers.

Referring to FIG. 7A, only four sense amplifiers, 332[0:3], are presented with one from each sector. The power supply node VN and VP of a sense amplifier, 332[0] for instance, are coupled to the Vss and the Vcc through a NMOS transistor 710[0] and a PMOS transistor 715[0], respectively. Four signals SNG[0:3] separately control the NMOS transistors 710[0:3]. Similarly, four signals SPGB[0:3] separately control the PMOS transistors 715[0:3]. For example, if rows represented by sense amplifier 332[2] need to be written, the signal SNG[2] will be set to the logic HIGH while the signals SNG[0:1] and SNG[3] remains at the logic LOW, and at the same time the signal SPGB[2] will be set to logic LOW while the signals SPGB[0:1] and SPGB[3] remains at the logic HIGH. Therefore the power, the Vss and the Vcc, are supplied to the sense amplifier 332[2] only. In this way, writing can start earlier than sensing without prematurely activating unselected sense amplifiers.

Referring to FIG. 7B, the four signals SNG[0:3] of FIG. 7A are replaced by two signals SN0G and SN1G, and a 2-to-4 decoder 720. Similarly, the four signals SPGB[0:3] of FIG. 7A are replaced by two signals SP0GB and SP1GB, and a 2-to-4 decoder 725. The power supply control in FIG. 7B works exactly the same as that in FIG. 7A, but there are less control signals running across the memory block and potentially saving layout area.

FIG. 7C shows another circuit for separately control power supply to the sense amplifiers. Again, a block of memory array is divided into four sectors, and so are the corresponding sense amplifiers. The four sense amplifier sectors are denoted as 740[0:3], each contains (k+1) number of sense amplifiers 332[0:k]. Using the sector 740[0] as an example, the node VN is coupled to the Vss through two NMOS transistors 750 and 760. The NMOS transistor 750 is controlled by a power control signal SN0G, which is coupled to all the sense amplifiers within a block, but different blocks have different power control signals. The NMOS transistor 760 is controlled by a select signal SSL[0], which is coupled to only the sector 740[0]. Each sector 740[i], where i=0~3, has its own select signal SSL[i], so that the node VN's connection to the Vss can be controlled sector by sector. Similarly, the node VP is coupled to the Vpp through two PMOS transistors 755 and 765. The PMOS transistor 755 is controlled by a power control signal SP0GB, which is coupled to all the sense amplifiers within a block, but different blocks have different power control signals. The NMOS transistor 765 is controlled by a select signal SSLB[0], which is coupled to only the sector 740[0]. Each sector 740[i], where i=0~3, has its own select signal SSLB[i], so that the node VP's connection to the Vcc can be controlled sector by sector. The circuit shown in FIG. 7C achieves the same goal of separately activating select and unselect sense amplifiers as the circuits shown in FIGS. 7A and 7B, so that a selected sector can be written ahead of starting sensing unselected sectors.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A write-sensing circuit for a semiconductor memory having at least one memory block with a continuous word-line (WL) being coupled to all the memory cells in a column of the memory block and a continuous bit-line (BL) being coupled to all the memory cells in a row of the memory block, the write-sensing circuit comprising:
   a first and a second sense amplifier adjacent to each other and belonging to the same memory block;
   a first switching device coupled between a first node of the first sense amplifier and a first power supply, the first switching device being controlled by a first signal;
   a second switching device coupled between the second sense amplifier and the first power supply, the second switching device being controlled by a second signal different from the first signal; and
   a MOS transistor coupled between the first node and a first local bit-line, the MOS transistor being controlled by a global bit-line,
   wherein when the first sense amplifier is activated, the second sense amplifier can remain de-activated.

2. The write-sensing circuit of claim 1, wherein the first power supply is a lower voltage power supply source (Vss) and the first and second switching devices are NMOS transistors.

3. The write-sensing circuit of claim 1, wherein the first power supply is a high voltage power supply source (Vcc) and the first and second switching devices are PMOS transistors.

4. The write-sensing circuit of claim 1 further comprising:
   a third switching device coupled between the first sense amplifier and a second power supply, the third switching device being controlled by a third signal different from both the first and second signals; and
   a fourth switching device coupled between the second sense amplifier and the second power supply, the fourth switching device being controlled by a fourth signal different from the first, second and third signals.

5. The write-sensing circuit of claim 4, wherein the first and the second power supplies are the Vss and the Vcc, respectively; the first and second switching devices are NMOS transistors and the third and fourth switching devices are PMOS transistors.

6. The write-sensing circuit of claim 1, wherein both the first switching device and the MOS transistor are NMOS transistors and the first power supply is the Vss.

7. The write-sensing circuit of claim 1, wherein both the first switching device and the MOS transistor are PMOS transistors and the first power supply is the Vcc.

8. The write-sensing circuit of claim 4 further comprising a fifth switching device serially connected with the MOS transistor and coupled between the first node and the local bit-line, the fifth switching device being controlled by a write-activated selection signal.

9. The write-sensing circuit of claim 8, wherein the MOS transistor and the fifth switching device are the same type of transistor.

10. A write-sensing circuit for a semiconductor memory having at least one memory block with a continuous word-line (WL) being coupled to all the memory cells in a column of the memory block and a continuous bit-line (BL) being coupled to all the memory cells in a row of the memory block, the write-sensing circuit comprising:
   a first and a second sense amplifier adjacent to each other and belonging to the same memory block;
   a first switching device coupled between a first node of the first sense amplifier and a low voltage power supply (Vss), the first switching device being controlled by a first signal;
   a second switching device coupled between a second node of the second sense amplifier and the Vss, the second switching device being controlled by a second signal different from the first signal;
   a third switching device coupled between a third node of the first sense amplifier and a high voltage power supply (Vcc), the third switch device being controlled by a third signal different from the first and second signal;
   a fourth switching device coupled between a fourth node of the second sense amplifier and the Vcc, the fourth switching device being controlled by a fourth signal different from the first, the second and the third signal; and
   a fifth switching device coupled between the first node and a first local bit-line, the fifth switching device being controlled by a first global bit-line,
   wherein when the first sense amplifier is activated, the second sense amplifier can remain de-activated.

11. The write-sensing circuit of claim 10, wherein the first and second switching devices are NMOS transistors; and the third and fourth switching devices are PMOS transistors.

12. The write-sensing circuit of claim 10, wherein the fifth switching device is a NMOS transistor.

13. The write-sensing circuit of claim 10 further comprising a sixth switching device serially connected with the fifth switching device and coupled between the first node and the first local bit-line, the sixth switching device being controlled by a write-activated selection signal.

14. The write-sensing circuit of claim 13, wherein the sixth switching devices is a NMOS transistor.

15. The write-sensing circuit of claim 13 further comprising a seventh switching device coupled between the third node of the first sense amplifier and a second local bit-line, the seventh switching device being controlled by a second global bit-line.

16. The write-sensing circuit of claim 15, wherein the seventh switching devices is a PMOS transistor.

17. The write-sensing circuit of claim 15 further comprising a eighth switching device serially connected with the seventh switching device and coupled between the third node of the first sense amplifier and the second local bit-line, the eighth switching device being controlled by a write-activated selection signal.

18. The write-sensing circuit of claim 17, wherein the eighth switching device is a PMOS transistor.

* * * * *